United States Patent
Mattoon et al.

(10) Patent No.: US 10,445,161 B2
(45) Date of Patent: Oct. 15, 2019

(54) CORRECTION FOR LINEAR INTERPOLATION ERROR

(71) Applicant: Schweitzer Engineering Laboratories, Inc., Pullman, WA (US)

(72) Inventors: Carl V. Mattoon, Austin, TX (US); Travis L. Mooney, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 442 days.

(21) Appl. No.: 15/056,319

(22) Filed: Feb. 29, 2016

(65) Prior Publication Data

US 2017/0248635 A1 Aug. 31, 2017

(51) Int. Cl.
*G06F 11/00* (2006.01)
*G01R 19/25* (2006.01)

(52) U.S. Cl.
CPC .......... *G06F 11/00* (2013.01); *G01R 19/2513* (2013.01)

(58) Field of Classification Search
CPC .................................................. G01R 13/0218
See application file for complete search history.

(56) References Cited

U.S. PATENT DOCUMENTS

| | | | |
|---|---|---|---|
| 7,583,771 B2 | 9/2009 | Zweigle | |
| 7,949,015 B2 | 5/2011 | Miljkovic | |
| 2011/0251732 A1* | 10/2011 | Schweitzer, III | ......... H02J 3/12 700/297 |
| 2014/0225626 A1* | 8/2014 | Venkatasubramanian | ................... G01R 19/2513 324/537 |

* cited by examiner

*Primary Examiner* — Yu-Hsi D Sun
(74) *Attorney, Agent, or Firm* — Jared L. Cherry; Bradley W. Schield

(57) ABSTRACT

The present disclosure pertains correcting linear interpolation errors. In one embodiment, a system comprises an input configured to receive the periodic signal at a first sampling rate and an output configured to provide an interpolated representation of the periodic signal at a second sampling rate. A linear interpolation subsystem may establish a ratio between the first sampling rate and the second sampling rate to determine a slip frequency. The linear interpolation subsystem creates an interpolated representation of the periodic signal based on the ratio. The interpolated representation of the periodic signal includes a deterministic error attributable to interpolation. A linear interpolation correction subsystem may correct the deterministic error attributable to the linear interpolation subsystem and create a corrected interpolated representation. An application interface subsystem may provide the corrected interpolated representation to an application.

18 Claims, 8 Drawing Sheets

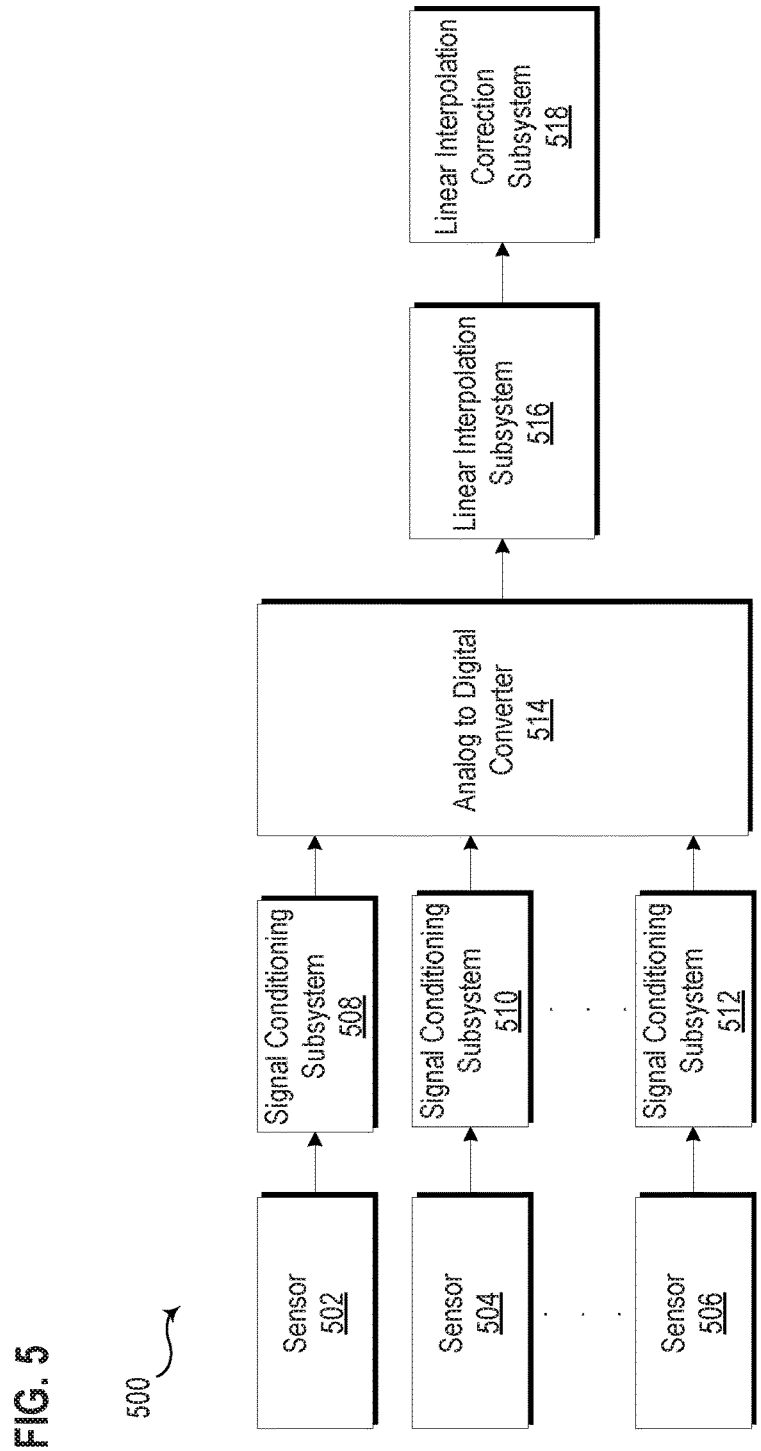

CORRECTION FOR LINEAR INTERPOLATION ERROR

TECHNICAL FIELD

The present disclosure pertains to systems and methods for correcting linear interpolation errors. More specifically, but not exclusively, various embodiments consistent with the present disclosure may be used to correct for an error introduced by linear interpolation in various applications in electric power distribution systems.

BRIEF DESCRIPTION OF THE DRAWINGS

Non-limiting and non-exhaustive embodiments of the disclosure are described, including various embodiments of the disclosure, with reference to the figures, in which:

FIG. 5 illustrates a conceptual representation of a system configured to correct a linear interpolation error consistent with embodiments of the present disclosure.

DETAILED DESCRIPTION

Figure 1:
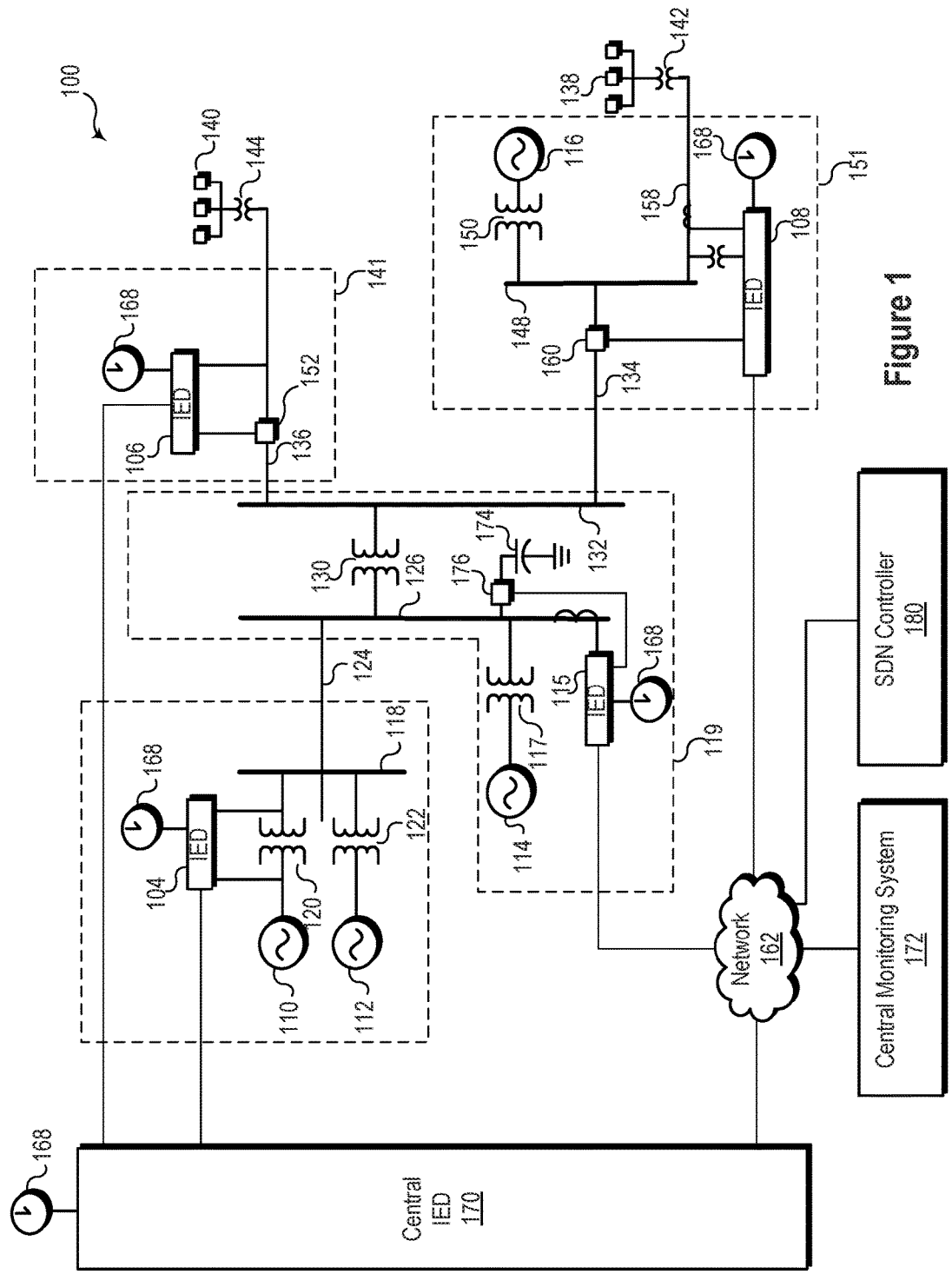
FIG. 1 illustrates a one-line diagram of an electric power transmission and distribution system in which a plurality of communication devices may facilitate communication in a network consistent with embodiments of the present disclosure.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates an example of an embodiment of a one-line diagram of an electric power delivery system 100 in which a plurality of sensors may be used to determine electrical conditions in system 100. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, and 158), circuit breakers (e.g., breakers 152, 160, 176), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout system 100. Utilizing a common or universal time source may ensure that IEDs have a synchronized time signal that can be used to generate time synchronized data, such as synchrophasors. In various embodiments, IEDs 104, 106, 108, 115, and 170 may receive a common time signal 168. The time signal may be distributed in system 100 using a communications network 162 or using a common time source, such as a Global Navigation Satellite System ("GNSS"), or the like.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

Communication via network 162 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

Periodic signals (e.g., alternating current) may be sampled at a variety of points in system 100. Information obtained by sampling the alternating current signals may be used to obtain information and used to control and maintain the stability of system 100. The sampled alternating current signals may be subjected to linear interpolation for a variety of purposes, including, phase adjustments, resampling to another rate, etc.

Linear interpolation provides certain advantages (e.g., it is less CPU-intensive than other forms of interpolation); however, linear interpolation can introduce errors due to the fact that by definition it imposes a linear relationship between adjacent points. The frequency response of the error of a linear interpolation is not flat. Rather, as the sampling rate decreases, the corresponding error increases. There are a variety of techniques that may be used to address an error introduced by linear interpolation. For example, the sampling rate may be increased to ensure that the error is within acceptable bounds; however, such an approach may not always be possible due to limitations on equipment or bandwidth.

In addition to use in electrical power systems, such as system 100, linear interpolation may be used in a variety of other applications. Such applications may include, but are not limited to radio frequency systems, digital audio system, and the like.

Figure 2:
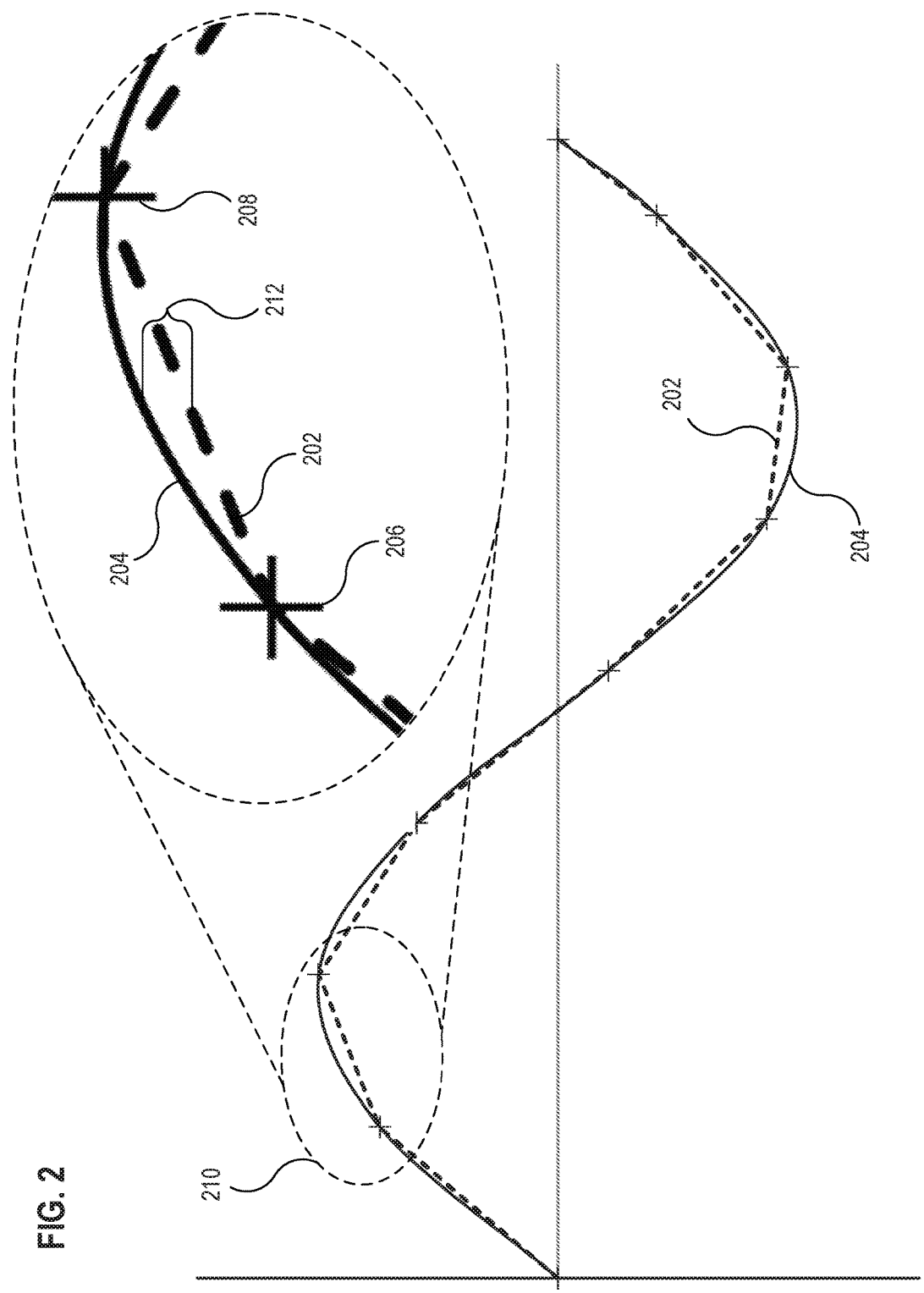
FIG. 2 illustrates a sinusoidal waveform, a linear interpolation of the sinusoidal waveform, and a resulting error at one specific point consistent with embodiments of the present disclosure.

FIG. 2 illustrates a sinusoidal waveform 204, a linear interpolation of the sinusoidal waveform 204, and a resulting error at one specific point 212 consistent with embodiments of the present disclosure. In some embodiments, the sinusoidal waveform 204 may represent an alternating current in an electric power distribution system. In other embodiments, the alternating current may represent another type of signal. Sampled points of the waveform are designated by "+" symbols. The linear interpolation 202 connects each of the sampled points using a linear line segment.

A section 210 of the sinusoidal waveform 204 and the linear interpolation 202 is enlarged between two samples 206, 208 to better illustrate an error at one specific point 212 based on the linear interpolation of a curved waveform. As shown, the error between the linear interpolation 202 and the sinusoidal waveform 204 varies between samples 206, 208, with the worst-case error falling midway between samples 206, 208. The linear interpolation error for a sine wave may be expressed using Eq. 1.

$$\text{Percent Error} = (1-k)*\sin\left(\pi*\left(.5 - \frac{k}{\text{Samps}}\right)\right) + k*\sin\left(\pi*\left(0.5 + \frac{(1-k)}{\text{Samps}}\right)\right), \quad \text{Eq. 1}$$

where $k$ is the interpolation point in the range of 0 to 1, and $$\text{Samps} = \frac{\text{Samples per Cycle}}{2}.$$

Figure 3A:
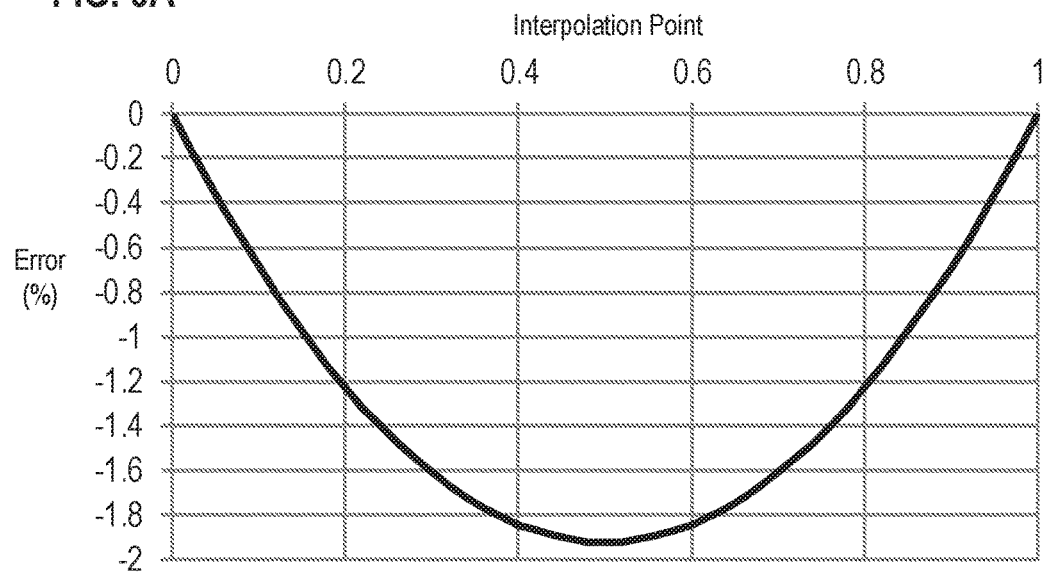
FIG. 3A illustrates a graph of an error function of a linear interpolation of a sinusoidal waveform consistent with embodiments of the present disclosure.

FIG. 3A illustrates a graph of an error function of a linear interpolation of a sinusoidal waveform consistent with embodiments of the present disclosure. The x-axis illustrates the interpolation point (the variable k in Eq. 1), which has a value between 0 and 1. The graph in FIG. 3A shows that the error is at a maximum at value of k=0.5, or the mid-point between two interpolation points. As noted in connection with FIG. 2, the maximum error falls at the midpoint between samples (i.e., k=0.5). In the graph illustrated in FIG. 3A, the error for a sample rate of sixteen samples per cycle reaches a maximum value of slightly more than −1.9%. The magnitude of the error can be reduced by increasing the sample rate. For example, at 512 samples per cycle, the worst-case error is about 0.002%. Correspondingly, decreasing the sample rate increases the error.

Figure 3B:
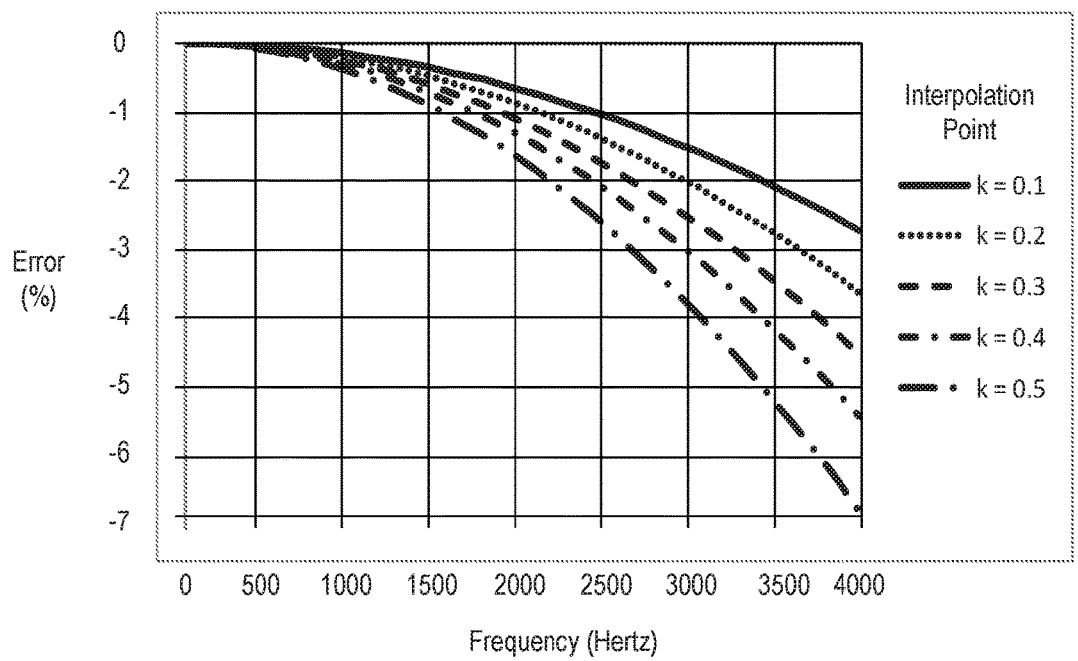
FIG. 3B illustrates a plurality of error functions associated with a corresponding plurality of interpolation values of a linear interpolation of a sinusoidal waveform over a range of frequency values consistent with embodiments of the present disclosure.

FIG. 3B illustrates a plurality of error functions associated with a corresponding plurality of interpolation values of a linear interpolation of a sinusoidal waveform over a range of frequency values consistent with embodiments of the present disclosure. As illustrated in FIG. 3B, the error attributable to linear interpolation increases as a frequency increases. The increase in error at higher frequencies reflects the increasing disparity between the curvature of the waveform and the linear segments between sample points. To address the combined effects of sampling rate and interpolation point on the error associated with interpolation, various systems and methods disclosed herein include a slip frequency between the input and output sampling rates of an interpolator.

Figure 4A:
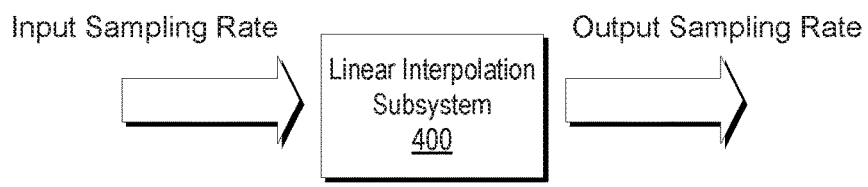
FIG. 4A illustrates a block diagram of a linear interpolation subsystem configured to receive a sampled signal at an input sampling rate and to output an interpolated representation of the sampled signal at an output sampling rate consistent with embodiments of the present disclosure.

FIG. 4A illustrates a block diagram of a linear interpolation subsystem 400 configured to receive a sampled signal at an input sampling rate and to output an interpolated representation of the sampled signal at an output sampling rate consistent with embodiments of the present disclosure. The difference between the input sampling rate and the output sampling rate causes the interpolation point to move, which effectively averages or normalizes the error. The error does not average to zero since it is always negative, as illustrated in FIG. 4B.

Figure 4B:
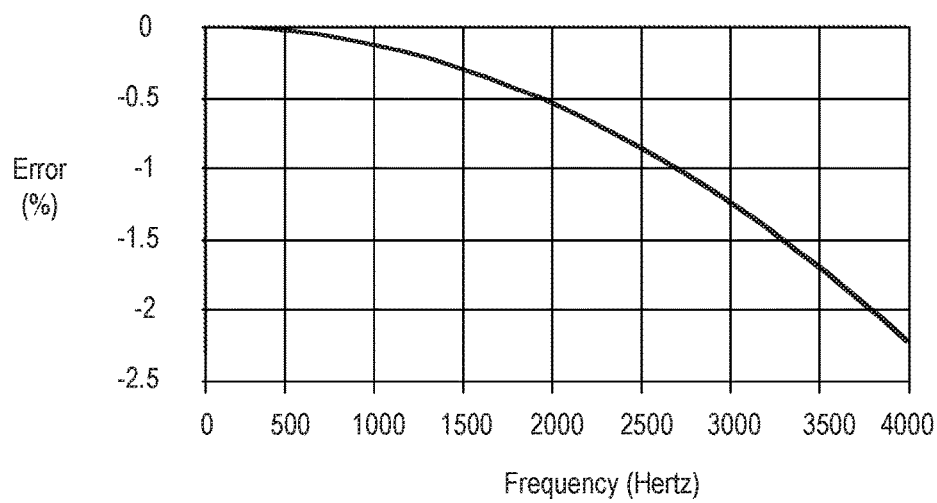
FIG. 4B illustrates a graph of a deterministic error function independent of interpolation values of a sinusoidal waveform created by an interpolator having a slip frequency between the input and output sampling rates consistent with embodiments of the present disclosure.

FIG. 4B illustrates a graph of a deterministic error function independent of interpolation values of a sinusoidal waveform created by an interpolator having a slip frequency between the input and output sampling rates consistent with embodiments of the present disclosure. As a result of the slip frequency, the interpolation point varies, which effectively normalizes the interpolation error. As such, the normalization is consistent for values k where 0<k<1. The normalization resulting from the slip frequency does not average to zero since the error is always negative. Given that the error is deterministic regardless of the value of k, a filter with gain that increases with frequency may be created to compensate for the error.

Figure 4C:
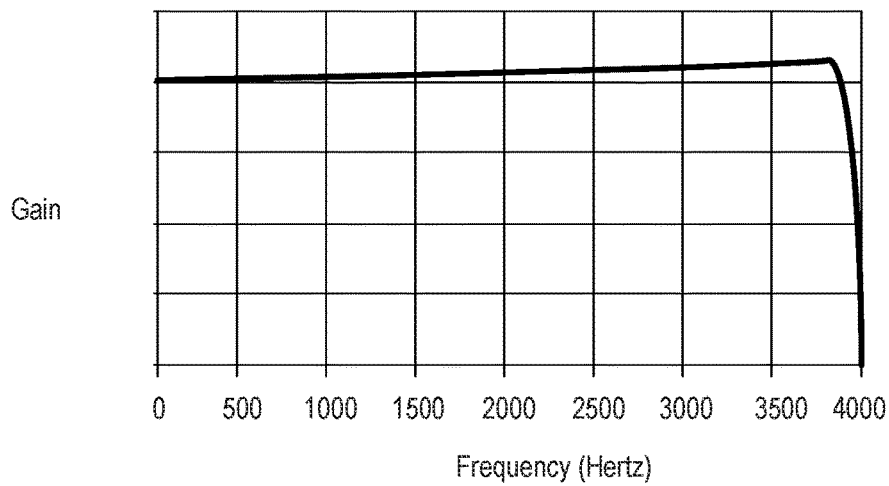
FIG. 4C illustrates a frequency response of a filter configured to compensate for the deterministic error function illustrated in FIG. 4B consistent with embodiments of the present disclosure.

FIG. 4C illustrates a frequency response of a filter configured to compensate for the deterministic error function illustrated in FIG. 4B consistent with embodiments of the present disclosure. The combination of the response illustrated in FIG. 4B, together with the filter with gain at the higher frequencies illustrated in FIG. 4C, may be used to compensate for an error attributable to linear interpolation. In various embodiments, the response illustrated in FIG. 4C may be implemented using a digital filter. In such embodiments, the values of the filter may be adjusted as needed to compensate for an error attributable to linear interpolation. In other embodiments, the filter may be implemented using hardware or other techniques. In various embodiments, a filter may be used by a linear interpolation correction subsystem to correct an error introduced by a linear interpolation process.

The examples provided in FIGS. 4B and 4C pertain to a specific function sampled at a specific sampling rate. As one of skill in the art will appreciate, the same techniques may be used to quantify the deterministic linear interpolation error associated with a function and sampling rate used in a particular application. The specific illustrated example has a sampling rate of 512 samples per cycle at 60 Hz, although a variety of sampling rates for any measure signal may be used. Based on the deterministic linear interpolation error, a linear interpolation correction subsystem may apply a filter created to offset the frequency response of an error function associated with a linear interpolation process. The deterministic error function created by the interpolator having a slip frequency between the input and output sampling rates and the filter may combine to provide a flat response regardless of the interpolation point and frequency.

FIG. 5 illustrates a conceptual representation of a system 500 configured to correct a linear interpolation error consistent with embodiments of the present disclosure. System 500 includes a plurality of sensors 502, 504, 506 that may be used to detect electrical conditions in an electrical power system. In various embodiments, sensors 502, 504, 506 may comprise, for example, voltage or current sensors. Any number of sensors may be utilized in various embodiments consistent with the present disclosure.

Each sensor 502, 504, 506, may provide an input to a signal conditioning subsystem 508, 510, 512. The signal conditioning subsystem 508, 510, 512 may be configured to perform one or more signal conditioning functions, such as amplifying the signal received from the sensor, compensating for non-linearity in the sensor, filtering the signal received from the sensor, etc. In some embodiments, the functions performed by signal conditioning subsystem 508, 510, 512 may be integrated into sensors 502, 504, 506.

An analog to digital (A/D) converter 514 may receive the outputs from signal conditioning subsystems 508, 510, and 512. The A/D converter 514 may be configured to receive the outputs of signal conditioning subsystems 508, 510, 512 and to create digitized representations of the signals detected by sensors 502, 504, and 506. In some embodiments, the functions performed by signal conditioning subsystem 508, 510, 512 may be integrated into A/D converter 514. In some embodiments, the A/D converter 514 may have a fixed sampling rate, while in other embodiments, the A/D converter 514 may have a variable sampling rate.

The output of the A/D converter 514 may be an input to a linear interpolation subsystem 516. According to one embodiment, the linear interpolation subsystem 516 may be configured to create slip between an input sample rate, $SR_{in}$, and an output sample rate, $SR_{out}$. In some embodiments, linear interpolation subsystem 516 may have a dynamic sampling rate that may allow linear interpolation subsystem 516 to vary the sampling rate used. If $SR_{in}$ is evenly divisible by $SR_{out}$ (i.e., the quotient of $SR_{in}/SR_{out}$ is an integer) there is no slip, and the interpolation point, k, remains at a constant point with respect to the waveform. As described above in connection with FIGS. 3A and 3B, the error is dependent on the interpolation point. In contrast, if $SR_{in}$ is not evenly divisible by $SR_{out}$, the interpolation point moves with respect to the waveform. As discussed in connection with FIG. 4B, the change of the interpolation point with respect to the waveform effectively averages or normalizes the interpolation error. In various embodiments, linear interpolation subsystem 516 may create slip between the values of $SR_{in}$ and $SR_{out}$ to achieve a deterministic error associated with linear interpolation.

A linear interpolation correction subsystem 518 may be configured to compensate for a deterministic error introduced by linear interpolation subsystem 516. As illustrated in FIG. 4B, the linear interpolation error does not average to zero since it is always negative and increases with increasing frequency. Accordingly, the linear interpolation correction subsystem 518 may be configured to provide gain at higher frequencies to an interpolated representation of a signal. The gain provided at a particular frequency by linear interpolation correction subsystem 518 may be selected such that the gain counteracts the error at that frequency introduced by linear interpolation subsystem 516.

Figure 6:
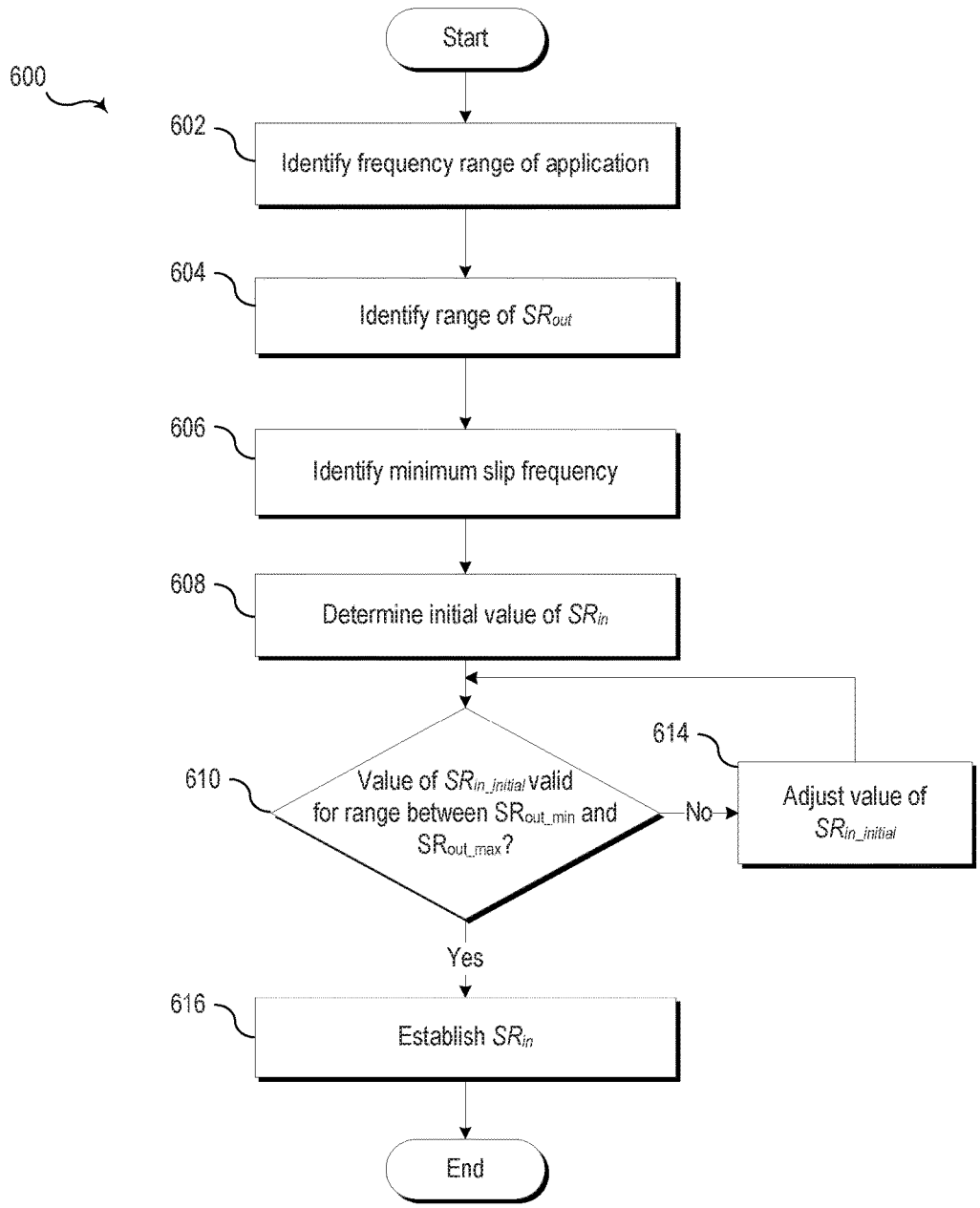
FIG. 6 illustrates a flowchart of a method for selecting a slip rate to compensate for linear interpolation error consistent with embodiments of the present disclosure.

FIG. 6 illustrates a flowchart of a method 600 for selecting a slip rate to compensate for linear interpolation error consistent with embodiments of the present disclosure. In some embodiments, a minimum slip frequency is equal to the inverse of the calculation period for an application using the data, as expressed in Eq. 2.

$$Slip_{min} = \frac{1}{\text{Calculation Period}} \qquad \text{Eq. 2}$$

For example, a root-mean-square (RMS) calculation may be determined over a period of time for various applications. RMS calculations may be used for revenue and power quality metering applications. In one specific example, the calculation period may be 16.7 ms, and accordingly, the minimum slip frequency would be 60 Hz. Similarly, the minimum slip frequency for an RMS calculation over 200 ms is 5 Hz. Some embodiments consistent with the present disclosure may utilize a constant slip rate, while other embodiments may utilize a dynamic or changing slip rate.

At 602, a frequency range of a particular application may be identified. The lower bound of the frequency range may be designated as $f_{min}$, and the upper bound of the frequency range may be designated as $f_{max}$. In some embodiments, the frequency range may be identified by receiving the range from a user. In other embodiments, the frequency range may be identified in other ways (e.g., monitoring a signal over a period of time to determine the frequency range). An example relating to an electrical power system is provided in connection with FIG. 6, however, the principles of the present disclosure are not limited to electric power systems. Electrical power systems typically operate at a nominal frequency of either 50 Hz or 60 Hz, and systems designed to operate in connection with electrical power systems may be configured to operate at either frequency. In addition the frequency range may include a range below 50 Hz and above 60 Hz to accommodate anomalous conditions. Accordingly, the frequency range of a system configured to operate in conjunction with an electric power system may be between approximately 40 Hz and 70 Hz.

At 604, a range of $SR_{out}$ may be determined based on the frequency range of the application, as determined at 602, and a sampling rate. The $SR_{out}$ may be determined as the product of the sampling rate and each of the $f_{min}$ and $f_{max}$, as shown in Eq. 3.

$$SR_{out\_min} = f_{min} * \text{Samples per Cycle}$$

$$SR_{out\_max} = f_{max} * \text{Samples per Cycle} \qquad \text{Eq. 3}$$

Continuing the example discussed above, the Samples per Cycle may be 512 samples per cycle over the range of 40 Hz to 70 Hz. Accordingly, the value of $SR_{out\_min}$ is 40 Hz multiplied by 512 samples per cycle, or 20480, and the value of $SR_{out\_max}$ is 70 Hz multiplied by 512 samples per cycle, or 35840.

At 606, a minimum slip frequency, $Slip_{min}$, may be determined. The value of $Slip_{min}$ may be determined based on Eq. 2. Continuing the example discussed above, the calculation period may be determined by the maximum frequency of 70 Hz. Accordingly, the calculation period may be 14.2857 milliseconds, and the minimum slip frequency may be 70 Hz. In other applications the maximum frequency need not necessarily correspond to the minimum slip frequency. If the calculation period is a function of multiple frequencies (e.g., 1 cycle, 12 cycles, 30 cycles), the highest frequency may be used to derive the minimum slip frequency.

At 608, an initial value of $SR_{in}$ may be determined. In some embodiments, the initial value of $SR_{in}$ may be determined using Eq. 4.

$$SR_{in\_initial} = SR_{out\_max} + Slip_{Min} \qquad \text{Eq. 4}$$

Continuing the example discussed above, the initial value of $SR_{in\_initial}$ may be 35910, which is equal to the sum of 35840 (i.e., $SR_{out\_max}$) and 70 (i.e., $Slip_{min}$).

At 610, the value of $SR_{in}$ may be validated for the range between $SR_{out\_min}$ and $SR_{out\_max}$. As discussed above, there is no slip if $SR_{in}$ is evenly divisible by $SR_{out}$. Accordingly, the validation at 610 may determine whether $SR_{out}$ divided by $SR_{in\_initial}$ yields an integer value. In some embodiments, the validation at 610 may be completed by determining specific values that would result in no slip by multiplying the value of $SR_{in}$ being examined by several integers and dividing by the sampling rate. Continuing the example discussed above, the first specific value of $SR_{in}$ that results in no slip is 17955 Hz (i.e., $SR_{in\_initial}/2$). Dividing the first specific value of $SR_{in}$ that results in no slip by the sampling rate of 512 samples per second yields 35.0684 Hz. Given that $f_{min}$ is 40 Hz, all values of $SR_{in}$ that results in no slip are below the permissible frequency range of the particular application.

Where a specific value of $SR_{in\_initial}$ would result in no slip, as determined at 610, the value of $SR_{in\_initial}$ may be adjusted at 614. After the adjusted value is determined at 614, method 600 may return to 610 to validate the value.

Once a value of $SR_{in\_initial}$ has been validated at 610 for the range between $SR_{out\_min}$ and $SR_{out\_max}$, the value may be established at 616.

Figure 7:
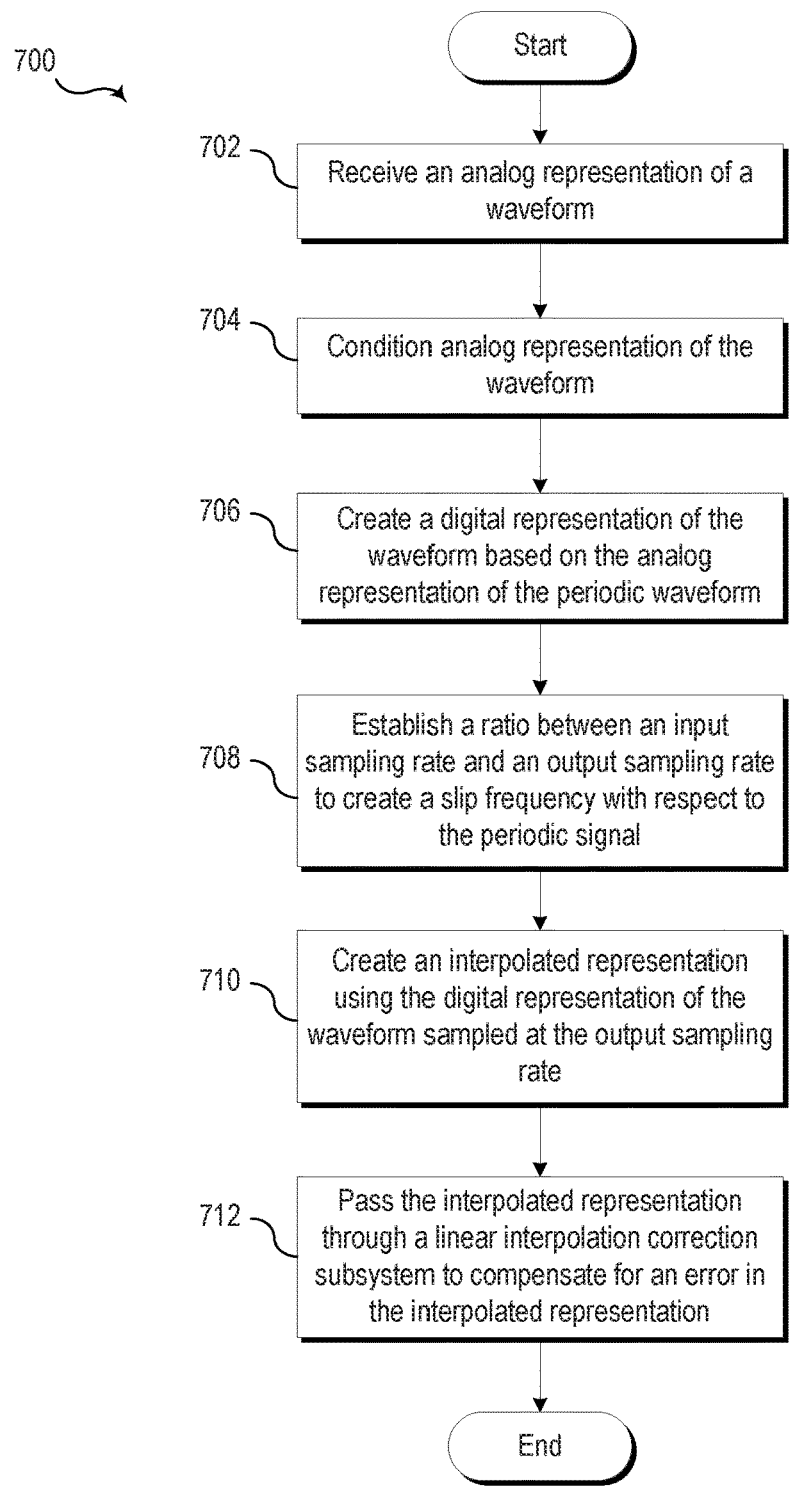
FIG. 7 illustrates a flowchart of a method for correcting linear interpolation error consistent with embodiments of the present disclosure.

FIG. 7 illustrates a flowchart of a method 700 for correcting linear interpolation error consistent with embodiments of the present disclosure. At 702 an analog representation of a waveform may be received. The analog representation of the waveform may correspond to a variety of signals. In some embodiments, the analog representation may be received from a sensor, such as sensors 502, 504, 506, as illustrated in FIG. 5 and described above. Returning to a discussion of FIG. 7, at 704, the analog representation of the waveform may be conditioned. In one example, the conditioning may be performed by a signal conditioning subsystem, such as signal conditioning subsystems 508, 510, and 512 as illustrated in FIG. 5 and described above.

At 706, a digital representation of the waveform may be created based on the analog representation of the waveform. In various embodiments, the digital representation of the waveform may be created by an A/D converter configured to sample the analog representation of the waveform. In one example, the digital representation of the waveform may be created by an A/D converter, such as A/D converter 514 as illustrated in FIG. 5 and described above.

At 708, a ratio may be established between an input sampling rate and an output sampling rate to create a slip frequency with respect to the periodic signal. As described above, an error attributable to interpolation may be rendered deterministic by selecting an output sampling rate that is not evenly divisible by the incoming sampling rate. Stated in other words, an output sampling rate may be selected such that the interpolation point varies with respect to the waveform in successive cycles of the waveform. In other words, if the sampling point happens to fall at a particular value (e.g., a maximum value, a zero-crossing) of the waveform in one period of the waveform, the sampling point will correspond to some other value of successive cycles. Variation of the point of interpolation thus normalizes the error associated with interpolation. Stated in other terms, varying the point of interpolation decouples the error attributable to interpolation independent of the interpolation point. In some embodiments, the interpolation rate may be determined using method 600, as illustrated in FIG. 6. Further, in some embodiments, the resulting error may exhibit a frequency response similar to the frequency response illustrated in FIG. 4B.

Returning to FIG. 7, at 710, an interpolated representation may be created using the digital representation of the waveform using the interpolation rate. The interpolated signal may be used for a variety of purposes, including, phase adjustments, resampling to another rate, etc. At 712, the interpolated representation may be passed through a linear interpolation correction subsystem to correct the error introduced by the linear interpolation. In some embodiments, the linear interpolation subsystem may apply a digital filter that includes a gain at higher frequencies to compensate for increasing error attributable to linear interpolation at higher frequencies. In some embodiments, the frequency response of the filter may be similar to the frequency response illustrated in FIG. 4C.

Figure 8:
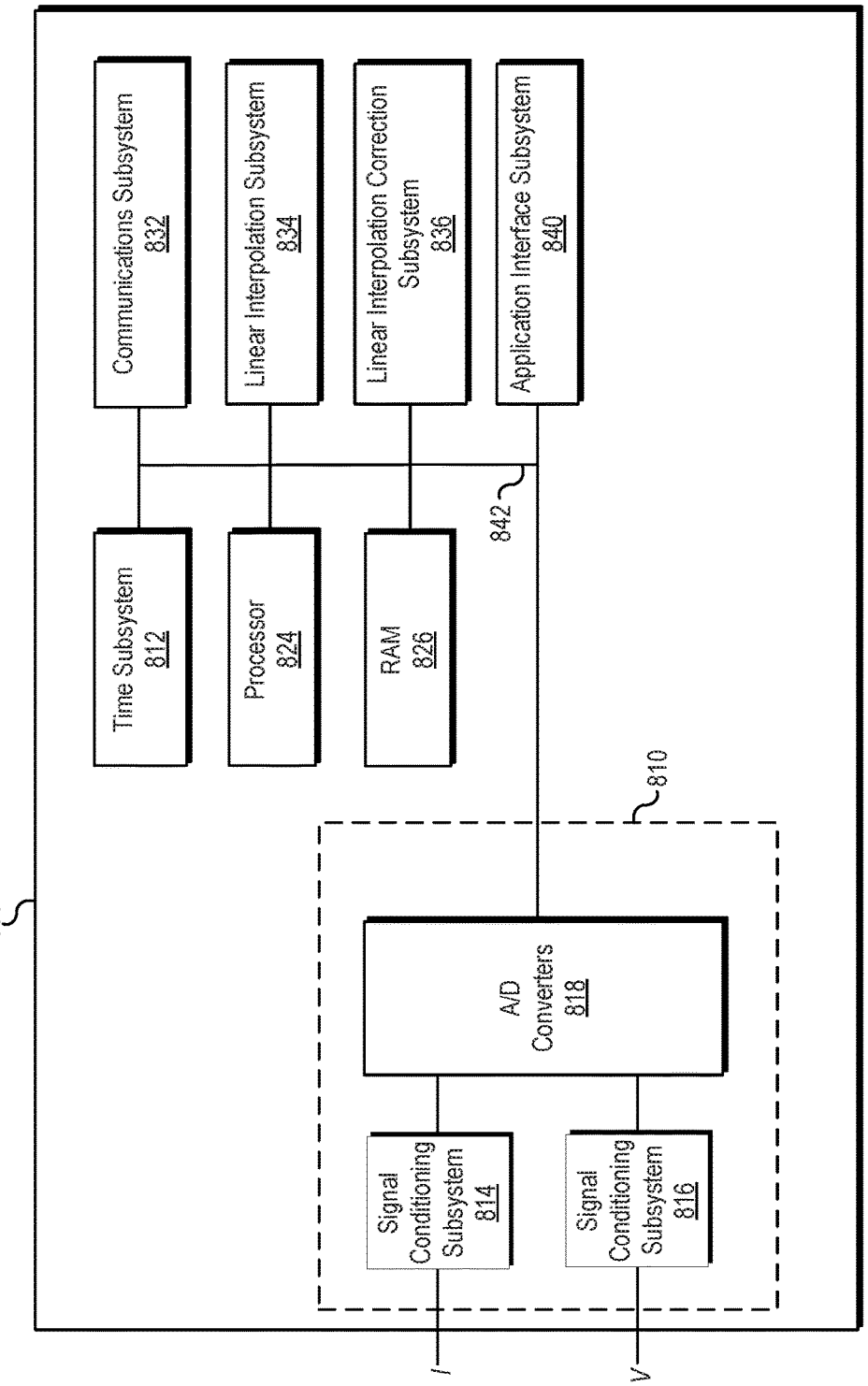
FIG. 8 illustrates a functional block diagram of a system configured to correct for linear interpolation error consistent with embodiments of the present disclosure.

FIG. 8 illustrates a functional block diagram of a system 800 configured to correct for linear interpolation error consistent with embodiments of the present disclosure. In some embodiments, system 800 may be implemented using hardware, software, firmware, and/or any combination thereof. Moreover, certain components or functions described herein may be associated with other devices or performed by other devices. The specifically illustrated configuration is merely representative of one embodiment consistent with the present disclosure. A data bus 842 may facilitate communication among various components of system 800.

System 800 includes a communications subsystem 832 configured to communicate with other devices (not shown). Communications interface 832 may facilitate communications with multiple devices. System 800 may further include a time subsystem 812, which may be used to receive a time signal (e.g., a common time reference) allowing system 800 to associate data with a time-stamp received from time system 812. In certain embodiments, a common time signal may be received via communications subsystem 832. One such embodiment may employ the IEEE 1588 protocol.

Processor 824 may be configured to process communications received via communications subsystem 832, time subsystem 812, and to coordinate the operation of the other components of system 800. Processor 824 may operate using any number of processing rates and architectures. Processor 824 may be configured to perform any of the various algorithms and calculations described herein. Processor 824 may be embodied as a general purpose integrated circuit, an application specific integrated circuit, a field-programmable gate array, and/or any other suitable programmable logic device. Instructions to be executed by processor 824 may be stored in random access memory 826 (RAM).

In certain embodiments, system 800 may include a sensor component 810. In the illustrated embodiment, sensor component 810 is configured to gather data directly from equipment such as a conductor in an electric power distribution system. The sensor component 810 may include signal conditioning subsystems 814, 816 that are configured to condition the signal for use by system 800. In some embodiments, the signal conditioning subsystems 814, 816 may include transformers configured to step down a voltage or current to a suitable level for use by system 800 or filters configured to limit the bandwidth of signals. Sensor component 810 may further include A/D converters 818 that may sample and/or digitize conditioned waveforms to form corresponding digitized signals. The digitized signals may be provided to data bus 842 and accessed by other components of system 800. In various embodiments, system 800 may be configured to interpolate the digitized signals created by sensor component 810.

A linear interpolation subsystem 834 may be configured to create an interpolated representation of digital representation of a signal. In various embodiments, linear interpolation subsystem 834 may be configured to establish an output sampling rate that results in a deterministic error. As described herein, an error attributable to interpolation may be rendered deterministic by selecting an output sampling rate that is not evenly divisible by the incoming sampling rate. Stated in other words, an output sampling rate may be selected such that the interpolation point varying with respect to the waveform in successive samples, thus normalizing the error associated with interpolation independent of the interpolation point. In some embodiments, linear interpolation subsystem 834 may determine the interpolation rate using method 600, as illustrated in FIG. 6. In various embodiments, linear interpolation subsystem 834 may be configured to interpolate a signal received from sensor component 810. In addition, linear interpolation subsystem 834 may be configured to interpolate a digital signal received from another system through communications subsystem 832.

A linear interpolation correction subsystem 836 may be configured to compensate for an error resulting from a linear interpolation operation and to create a corrected interpolated representation. The corrected interpolated representation includes a correction of a deterministic error in the interpolated representation created by the interpolation process. In various embodiments, linear interpolation correction subsystem 836 may be configured to determine the error characteristics introduced by the linear interpolation process performed by linear interpolation subsystem 834 and to apply a filter or another corrective technique to an interpolated representation to create the corrected interpolated presentation. For example, the linear interpolation correction subsystem 836 may be configured to quantify the error associated with the interpolation error and to create a filter having the appropriate response to compensate for the error. A filter exhibiting a gain at higher frequencies may be used to compensate for increasing error attributable to linear interpolation at higher frequencies. In some embodiments, linear interpolation correction may utilize techniques in addition to filters to correct an error introduced by a linear interpolation process.

An application interface subsystem 840 may be configured to interact with one or more applications configured to use a corrected interpolated representation of the signal. In one embodiment, application interface subsystem 840 may be configured to perform root-mean-square (RMS) calculation on electrical power delivered to a load. In another embodiment, application interface subsystem 840 may be configured to assess the quality of electrical power delivered to a load.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system configured to correct a linear interpolation error in an interpolated representation of a periodic signal of electrical power delivered to a load, the system comprising:
    a sensor configured to receive an analog representation of the periodic signal;
    a signal conditioning subsystem configured to condition the analog representation of the periodic signal and to create a conditioned representation;
    an analog to digital converter subsystem configured to receive the conditioned representation and to create a digital representation of the conditioned representation at a first sampling rate;
    an output configured to provide an interpolated representation of the periodic signal at a second sampling rate, different from the first sampling rate;
    a memory;
    a processor operatively coupled to the memory, wherein the processor is configured to:
        establish a ratio between the first sampling rate and the second sampling rate to determine a slip frequency with respect to the periodic signal;
        create the interpolated representation of the periodic signal based on the ratio, the interpolated representation of the periodic signal comprising a deterministic error attributable to interpolation;
        correct the deterministic error to create a corrected interpolated representation; and
        provide the corrected interpolated representation to an application to allow assessment of the electrical power delivered to the load.

2. The system of claim 1, wherein the slip frequency is inversely proportional to a calculation period of the application.

3. The system of claim 2, wherein the slip frequency causes an interpolation point to vary with respect to successive cycles of the periodic signal.

4. The system of claim 3, wherein the first sampling rate is proportional to the product of $f_{max}$ and a specified number of samples per cycle plus the slip frequency.

5. The system of claim 1, wherein the processor is configured to determine that the ratio between the first sampling rate and the second sampling rate ensures slip for all values within a frequency range.

6. The system of claim 5, wherein the processor is configured to adjust the ratio whenever the first sampling rate is evenly divisible by the second sampling rate.

7. The system of claim 1, wherein at least one of the first sampling rate and the second sampling rate is variable.

8. The system of claim 1, wherein the processor is configured to apply a digital filter to the interpolated representation to create the corrected interpolated representation.

9. The system of claim 1, wherein the processor is configured to apply a filter to the interpolated representation of the periodic signal to create the corrected interpolated representation.

10. The system of claim 9, wherein the processor is configured to adjust parameters of the filter based on the deterministic error in the interpolated representation.

11. A method for correcting a linear interpolation error, the method comprising:
    receiving an analog representation of a periodic signal;
    conditioning the analog representation of the periodic signal to create a conditioned representation;
    creating, via an analog-to-digital converter, a digital representation at a first sampling rate;
    providing an interpolated representation of the periodic signal at a second sampling rate, different from the first sampling rate;
    establishing a ratio between the first sampling rate and the second sampling rate to create a slip frequency with respect to the periodic signal;
    creating the interpolated representation of the periodic signal based on the ratio, the interpolated representation of the periodic signal comprising a deterministic error attributable to interpolation;
    correcting the deterministic error attributable to create creating a corrected interpolated representation; and
    providing the corrected interpolated representation to an application to allow assessment of the electrical power delivered to the load.

12. The method of claim 11, wherein the minimum slip frequency is inversely proportional to a calculation period of the application.

13. The method of claim 11, wherein the slip frequency causes an interpolation point to vary with respect to successive cycles of the periodic signal.

14. The method of claim 11, further comprising applying a digital filter to the interpolated representation to create the corrected interpolated representation.

15. The method of claim 11, wherein creating the corrected interpolated representation comprises applying a filter to the interpolated representation.

16. The method of claim 15 further comprising:
adjusting the parameters of the filter based on the deterministic error in the interpolated representation.

17. A non-transitory, computer-readable media, comprising instructions configured to be executed by one or more processors, wherein the instructions are configured to cause the one or more processors to:
receive, via a digital-to-analog converter, a digital representation of a periodic signal on an electric power delivery system at a first sampling rate;
provide an interpolated representation of the periodic signal at a second sampling rate, different from the first sampling rate;
establish a ratio between the first sampling rate and the second sampling rate to determine a slip frequency with respect to the periodic signal;
create an interpolated representation of the periodic signal based on the ratio, the interpolated representation of the periodic signal comprising a deterministic error attributable to interpolation;
apply a filter to the interpolated representation to correct the deterministic error to create a corrected interpolated representation; and
output the corrected interpolation representation to an application to allow assessment of the electrical power delivered to a load of the electric power delivery system.

18. The non-transitory, computer-readable media of claim 17, wherein the instructions are configured to cause the one or more processors to select a second sampling rate that is not evenly divisible by the first sampling rate.

* * * * *